(12) United States Patent
Sudo (10) Patent No.: US 8,866,206 B2
(45) Date of Patent: Oct. 21, 2014

(54) INTEGRATED CIRCUIT DEVICE AND METHOD FOR MANUFACTURING SAME

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,407

(22) Filed: Mar. 1, 2012

(65) Prior Publication Data

US 2013/0037871 A1 Feb. 14, 2013

(30) Foreign Application Priority Data

Aug. 8, 2011 (JP) .................................. 2011-172876

(51) Int. Cl.
| | |
|---|---|
| *H01L 21/02* | (2006.01) |
| *H01L 27/088* | (2006.01) |
| *H01L 21/762* | (2006.01) |
| *H01L 21/8234* | (2006.01) |

(52) U.S. Cl.
CPC ...... *H01L 21/76224* (2013.01); *H01L 27/0886* (2013.01); *H01L 21/823431* (2013.01)
USPC ........... 257/295; 257/347; 257/392; 257/332; 257/368; 257/324; 257/288; 257/401; 473/3; 473/164; 473/591; 473/268

(58) Field of Classification Search
CPC .................. H01L 27/10894; H01L 27/11582; H01L 27/11578; H01L 27/105; H01L 27/108; H01L 28/90; H01L 27/10879; H01L 27/11575; H01L 21/76; H01L 21/76224; H01L 21/8239
USPC ......... 257/295, 347, 392, 332, 368, 324, 288, 257/401; 438/3, 164, 591, 268
See application file for complete search history.

(56) References Cited

U.S. PATENT DOCUMENTS

| | | | | |
|---|---|---|---|---|
| 2007/0272971 | A1* | 11/2007 | Lee et al. | 257/321 |
| 2008/0073730 | A1* | 3/2008 | Lee et al. | 257/401 |
| 2010/0041224 | A1* | 2/2010 | Park et al. | 438/591 |
| 2011/0147848 | A1* | 6/2011 | Kuhn et al. | 257/368 |

FOREIGN PATENT DOCUMENTS

JP 2011-9296 A 1/2011

OTHER PUBLICATIONS

U.S. Appl. No. 13/233,379, filed Sep. 15, 2012, Gaku Sudo.
Fu-Liang Yang, et al., "35nm CMOS FinFETs", Symposium on VLSI Technology Digest of Technical Papers, Jun. 11, 2002, 2 pages.

* cited by examiner

*Primary Examiner* — Fernando L Toledo
*Assistant Examiner* — Mohammed Shamsuzzaman
(74) *Attorney, Agent, or Firm* — Oblon, Spivak, McClelland, Maier & Neustadt, L.L.P.

(57) ABSTRACT

An integrated circuit device includes a plurality of fins on an upper surface of a semiconductor substrate and extending in a first direction, a device isolation insulating film placed between the fins, a gate electrode extending in a second direction crossing the first direction on the insulating film; and an insulating film insulating the fin from the gate electrode. In a first region where a plurality of the fins are consecutively arranged, an upper surface of the device isolation insulating film is located at a first position below an upper end of the fin. In a second region located in the second direction as viewed from the first region, the upper surface of the device isolation insulating film is located at a second position above the upper end of the fin. In the second region, the device isolation insulating film covers entirely a side surface of the fin.

9 Claims, 7 Drawing Sheets

INTEGRATED CIRCUIT DEVICE AND METHOD FOR MANUFACTURING SAME

CROSS-REFERENCE TO RELATED APPLICATIONS

This application is based upon and claims the benefit of priority from the prior Japanese Patent Application No. 2011-172876, filed on Aug. 8, 2011; the entire contents of which are incorporated herein by reference.

FIELD

Embodiments described herein relate generally to an integrated circuit and method for manufacturing same.

BACKGROUND

Recently, in order to achieve compatibility between increased integration density and increased on-current in a MOSFET (metal-oxide-semiconductor field-effect transistor), a fin type MOSFET (hereinafter referred to as "FinFET") has been proposed. In a FinFET, a projected fin extending in one direction is formed on the upper surface of a semiconductor substrate. A gate electrode extending in another direction is provided so as to straddle this fin. Hence, the outer periphery of the portion of the fin surrounded with the gate electrode constitutes a channel region. Thus, the channel width can be lengthened without increasing the device area.

However, with the downsizing of the FinFET, it is difficult to uniformly form a large number of FinFETs.

DETAILED DESCRIPTION

In general, according to one embodiment, an integrated circuit device includes: a plurality of fins formed on an upper surface of a semiconductor substrate and extending in a first direction; a device isolation insulating film placed between the fins; a gate electrode extending in a second direction crossing the first direction and provided on the device isolation insulating film; and an insulating film insulating the fin from the gate electrode. In a first region where a plurality of the fins are consecutively arranged, an upper surface of the device isolation insulating film is located at a first position below an upper end of the fin, and in a second region located in the second direction as viewed from the first region, the upper surface of the device isolation insulating film is located at a second position above the upper end of the fin. In the second region, the device isolation insulating film covers entirely a side surface of the fin.

According to another embodiment, an integrated circuit device includes: a plurality of fins formed on an upper surface of a semiconductor substrate and extending in a first direction; a plurality of wide fins formed on the upper surface of the semiconductor substrate, extending in the first direction, and having a wider width than the fin; a device isolation insulating film placed between the fins and the wide fins; a gate electrode extending in a second direction crossing the first direction and provided on the device isolation insulating film; and an insulating film insulating the fin and the wide fin from the gate electrode. In a first region where the fins are arranged, an upper surface of the device isolation insulating film is located at a first position below an upper end of the fin, and in a second region where the wide fins are arranged, the upper surface of the device isolation insulating film is located at a second position above the upper end of the fin. In the second region, the device isolation insulating film covers entirely a side surface of the wide fin.

According to another embodiment, an integrated circuit device includes: a plurality of fins formed on an upper surface of a semiconductor substrate and extending in a first direction; a wide fin formed on the upper surface of the semiconductor substrate, extending in the first direction, and having a wider width than the fin; a device isolation insulating film placed between the fins and the wide fin; a gate electrode extending in a second direction crossing the first direction and provided on the device isolation insulating film; and an insulating film insulating the fin from the gate electrode. A plurality of imaginary lines extend in the first direction, are arranged periodically in the second direction, and each is located inside the fin or the wide fin being able to be established. Each of the fins contains one of the lines, and the wide fin contains two of the lines.

According to another embodiment, a method for manufacturing an integrated circuit device includes: forming a plurality of first resist members extending in a first direction and periodically arranged on a stacked body in which a first insulating film, a second insulating film different in composition from the first insulating film, a third insulating film different in composition from the second insulating film, and a fourth insulating film different in composition from the third insulating film are stacked in this order on a semiconductor substrate; processing the fourth insulating film into a plurality of core members by etching using the first resist members as a mask; forming sidewalls on both side surfaces of the core member; removing at least a subset of the core members; processing the third insulating film and the second insulating film into a plurality of mask members by etching using the sidewalls as a mask; dividing the first insulating film and processing an upper portion of the semiconductor substrate into a plurality of fins extending in the first direction by etching using the mask members as a mask; burying a device isolation insulating film between the fins; performing planarization treatment on the device isolation insulating film using the first insulating film as a stopper; exposing a first region where a plurality of the fins are consecutively arranged, and forming a second resist member covering a second region located in a second direction crossing the first direction as viewed from the first region; causing an upper surface of a portion of the device isolation insulating film located in the first region to be located below an upper end of the fin by etching using the second resist member as a mask; forming a gate insulating film on an exposed surface of the fin; and forming a gate electrode extending in the second direction on the device isolation insulating film.

An embodiment of the invention will now be described with reference to the drawings.

Figure 1A:
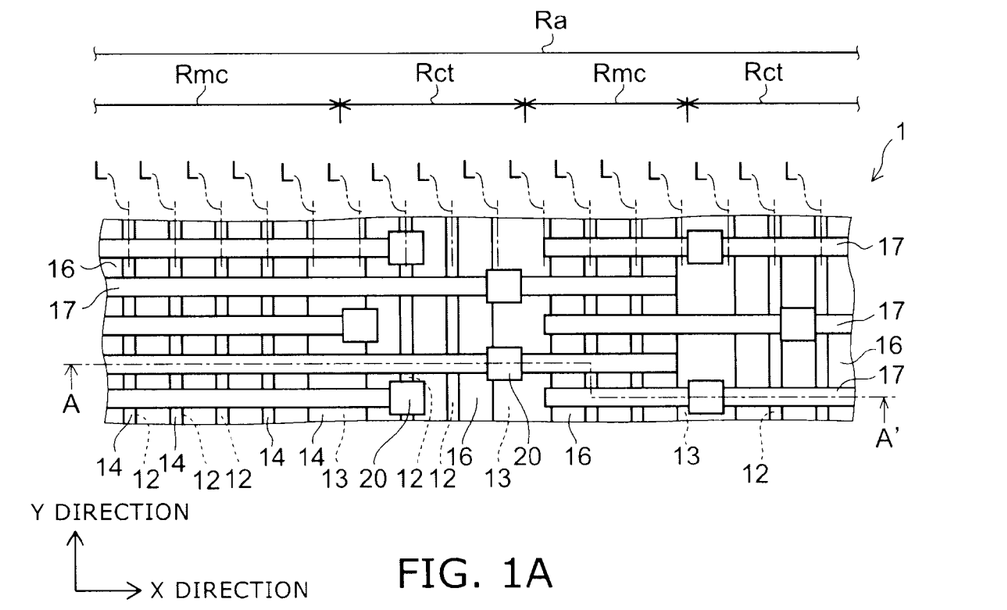
FIG. 1A is a plan view illustrating an integrated circuit device according to the embodiment.
Figure 1B:
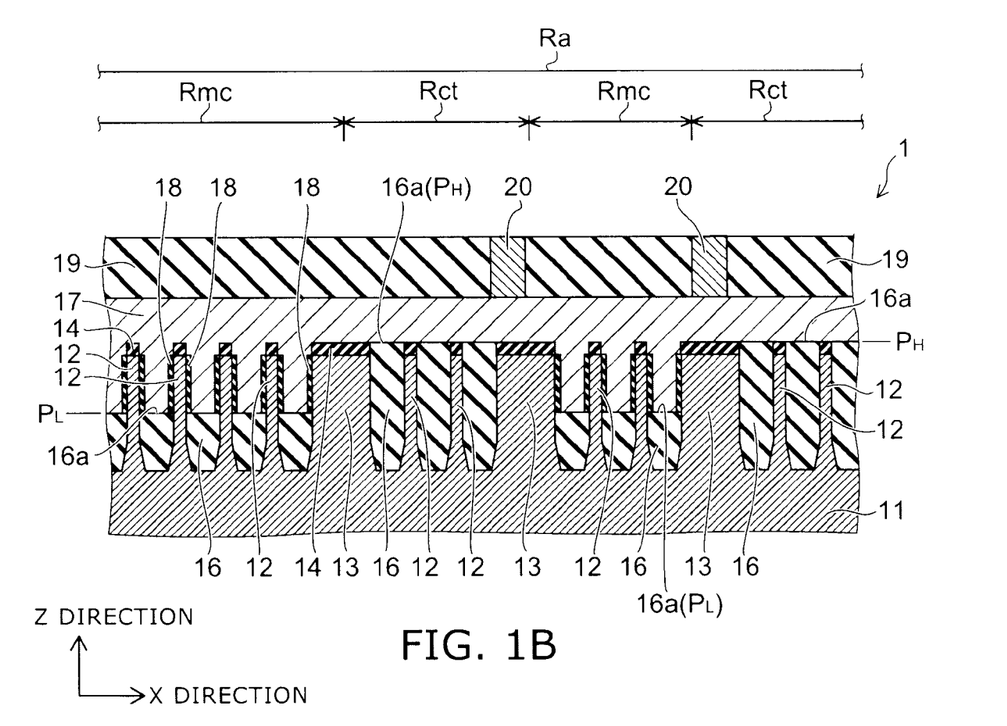
FIG. 1B is a sectional view taken along line A-A' shown in FIG. 1A.

FIG. 1A is a plan view illustrating an integrated circuit device according to the embodiment. FIG. 1B is a sectional view taken along line A-A' shown in FIG. 1A.

Figure 2:
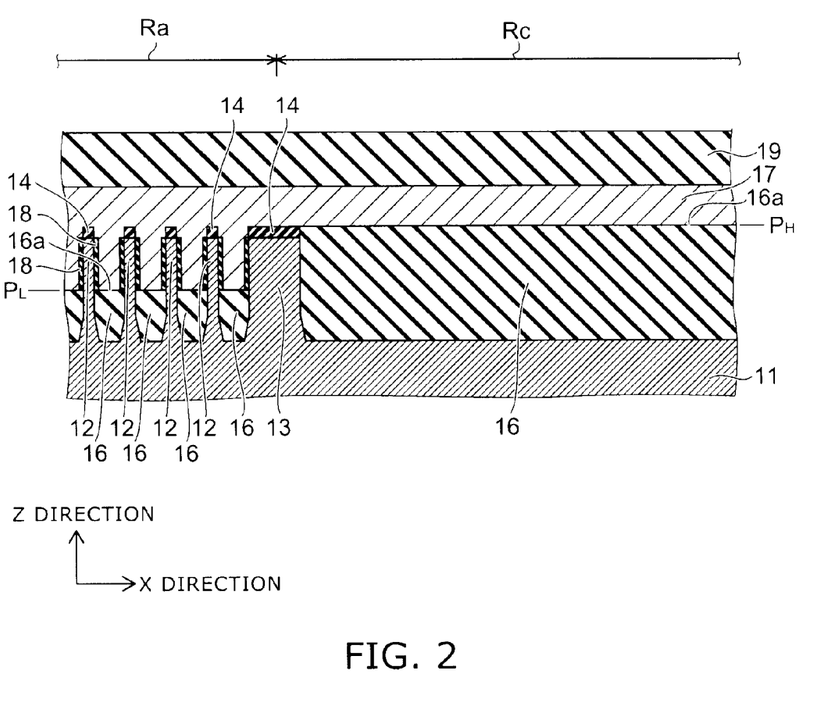
FIG. 2 is a sectional view illustrating the vicinity of the boundary region between the memory array region and the core region in the integrated circuit device according to the embodiment.

FIG. 2 is a sectional view illustrating the vicinity of the boundary region between the memory array region and the core region in the integrated circuit device according to the embodiment.

The integrated circuit device according to the embodiment is e.g. a memory device, and more particularly an MRAM (magnetoresistive random access memory). In an MRAM, a plurality of memory cells are arrayed. Each memory cell includes a magnetoresistive memory element and a transistor. In the embodiment, the transistor constituting each memory cell is a FinFET.

As shown in FIGS. 1A and 1B and FIG. 2, in the integrated circuit device 1 (hereinafter also simply referred to as "device 1") according to the embodiment, a memory array region Ra and a core region Rc are defined. In the memory array region Ra, memory cells are arrayed. The core region Rc includes a switching element (not shown) for switching whether to supply a potential to the gate electrode of the memory cell. In the memory array region Ra, memory cell regions Rmc and contact regions Rct are defined. The memory cell regions Rmc and the contact regions Rct are alternately arranged along one direction. In the following, the arrangement direction of the memory cell regions Rmc and the contact regions Rct is referred to as "X direction".

The integrated circuit device 1 includes a silicon substrate 11 made of a semiconductor material such as silicon. In the memory array region Ra, on the upper surface of the silicon substrate 11, a plurality of fins 12 extending in the direction (hereinafter referred to as "Y direction") orthogonal to the X direction are formed. The fin 12 is formed integrally with the silicon substrate 11. The fin 12 has a generally plate-like shape having a major surface parallel to the direction perpendicular to the upper surface of the silicon substrate 11 (hereinafter referred to as "Z direction") and the Y direction. However, the side surface of the root portion of the fin 12 is sloped with respect to the Z direction. The width of the root portion is expanded downward in a tapered shape.

Furthermore, on the upper surface of the silicon substrate 11, a wide fin 13 extending in the Y direction is also formed. The height of the wide fin 13 is equal to the height of the fin 12. The width of the wide fin 13 is wider than the width of the fin 12, and nearly equal to the sum of the distance between two adjacent fins 12 and the widths of two fins 12. The shape of the wide fin 13 is also generally plate-like, and the root portion is expanded in a tapered shape. A silicon nitride film 14 is provided immediately above each fin 12 and each wide fin 13.

As shown in FIGS. 1A and 1B, in the memory cell region Rmc, a plurality of fins 12 are consecutively arranged. Furthermore, also in the contact region Rct, a plurality of fins 12 are consecutively arranged. At the boundary between the memory cell region Rmc and the contact region Rct, the wide fin 13 is placed.

In the device 1, a plurality of imaginary lines L extending in the Y direction, arranged periodically in the X direction, and each located inside the fin 12 or the wide fin 13 can be established. In this case, each fin 12 contains one line L, and each wide fin 13 contains two lines L. The spaces between the lines L can be sequentially numbered along the X direction. Then, all the spaces located inside the wide fins 13 are either at least a subset of the odd-numbered spaces or at least a subset of the even-numbered spaces. For instance, if the first space is located inside a wide fin 13, the spaces located inside the other wide fins 13 are limited to the odd-numbered spaces such as the third space and the fifth space, and no even-numbered space is located inside the wide fins 13.

A device isolation insulating film 16 is placed between the fins 12 and the wide fins 13. The device isolation insulating film 16 is formed from an insulative material such as silicon oxide. In the memory cell region Rmc, the upper surface 16a of the device isolation insulating film 16 is located at a position $P_L$ below the upper end of the fin 12. On the other hand, in the contact region Rct, the upper surface 16a of the device isolation insulating film 16 is located at a position $P_H$ above the upper end of the fin 12. Thus, in the contact region Rct, the device isolation insulating film 16 covers entirely the side surface of the fin 12. The position $P_L$ is e.g. a position around the midpoint between the upper end and the lower end of the fin 12. The position $P_H$ is e.g. the same as the position of the upper surface of the silicon nitride film 14.

On the device isolation insulating film 16, a plurality of gate electrodes 17 extending in the X direction are provided. The gate electrode 17 is formed from a conductive material such as metal. The upper surface of the gate electrode 17 is generally flat. The lower surface of the gate electrode 17 is in contact with the upper surface of the device isolation insulating film 16. In the memory cell region Rmc, the upper surface 16a of the device isolation insulating film 16 is located at the position $P_L$. Hence, the gate electrode 17 is relatively thick. On the other hand, in the contact region Rct, the upper surface 16a of the device isolation insulating film 16 is located at the position $P_H$. Hence, the gate electrode 17 is relatively thin.

A gate insulating film 18 is provided between the side surface of the fin 12 and the gate electrode 17, and between the side surface of the wide fin 13 and the gate electrode 17. The gate insulating film 18 is formed from an insulative material such as silicon oxide. The gate insulating film 18 covers the region not covered with the device isolation insulating film 16 on the side surface of the fin 12 and the side surface of the wide fin 13. On the other hand, the aforementioned silicon nitride film 14 is interposed between the upper surface of the fin 12 and the gate electrode 17, and between the upper surface of the wide fin 13 and the gate electrode 17. The silicon nitride film 14 and the gate insulating film 18 constitute an insulating film for insulating the fin 12 and the wide fin 13 from the gate electrode 17. The electrical film thickness of the silicon nitride film 14 is thicker than the electrical film thickness of the gate insulating film 18. On the device isolation insulating film 16, an interlayer insulating film 19 is formed so as to cover the gate electrode 17. Here, in FIG. 1A, the gate insulating film 18 and the interlayer insulating film 19 are not shown. In the contact region Rct, contacts 20 are provided in the interlayer insulating film 19. The lower end of each contact 20 is connected to part of the corresponding gate electrode 17.

On the other hand, as shown in FIG. 2, the wide fin 13 is provided also at the boundary between the memory array region Ra and the core region Rc. In the core region Rc, no fin 12 is formed, and the upper surface 16a of the device isolation insulating film 16 is located at the position $P_H$. Furthermore, the gate electrode 17 extends out from the memory array region Ra to the core region Rc. In the core region Rc, the upper surface 16a of the device isolation insulating film 16 is located at the position $P_H$. Hence, the gate electrode 17 is relatively thin.

In the memory cell region Rmc, the upper portion of the fin 12 is surrounded with the gate electrode 17 via the gate insulating film 18 and the silicon nitride film 14. Hence, a FinFET is configured at each nearest point between the fin 12 and the gate electrode 17. On the other hand, in the contact region Rct, the fin 12 is entirely covered with the device isolation insulating film 16. Hence, no FinFET is configured.

Next, a method for manufacturing an integrated circuit device according to the embodiment is described.

FIGS. 3A to 3C, FIGS. 4A to 4C, FIGS. 5A to 5C are process sectional views illustrating the method for manufacturing an integrated circuit device according to the embodiment, and show the memory array region.

Figure 3A:
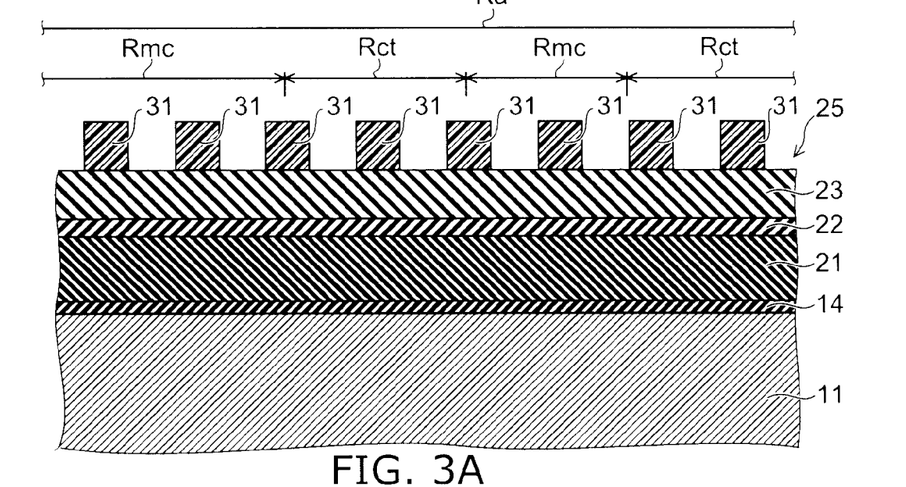
FIGS. 3A to 3C are process sectional views illustrating the method for manufacturing an integrated circuit device according to the embodiment.

First, as shown in FIG. 3A, a silicon substrate 11 is prepared. In the silicon substrate 11, a memory array region Ra and a core region Rc are defined. In the memory array region Ra, memory cell regions Rmc and contact regions Rct are defined and alternately arranged along the X direction.

On the silicon substrate 11, a silicon nitride film 14, a silicon oxide film 21, a silicon nitride film 22, and a silicon oxide film 23 are stacked in this order to form a stacked body 25. Next, on the stacked body 25, an antireflection film (not shown) is formed as necessary, and then a resist film is formed. Next, by the photolithography method, this resist film is patterned. Thus, in the memory array region Ra, a plurality of resist members 31 extending in the Y direction and arranged periodically are formed. The arrangement pitch of the resist members 31 is set to as short as e.g. the limit of exposure technology.

Figure 3B:
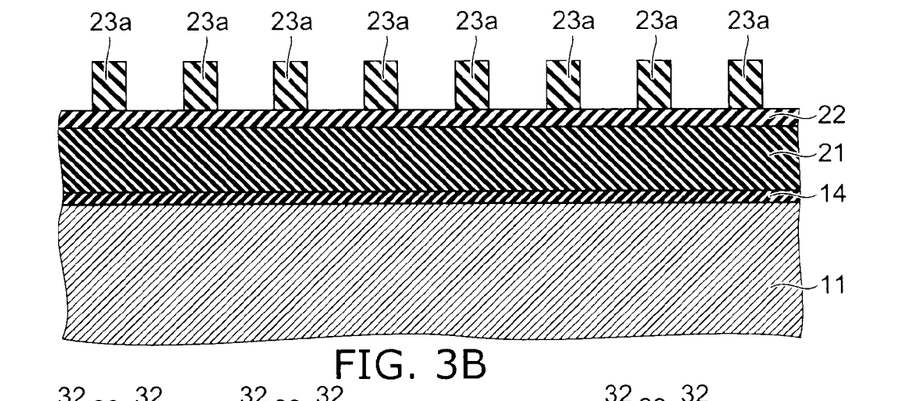

Next, as shown in FIG. 3B, the resist members 31 are used as a mask to perform etching such as anisotropic etching. Thus, the silicon oxide film 23 is selectively removed. Accordingly, the pattern of the resist members 31 is transferred to the silicon oxide film 23. Thus, the silicon oxide film 23 is processed into a plurality of core members 23a extending in the Y direction. Next, as necessary, by wet treatment, the core member 23a is slimmed.

Figure 3C:
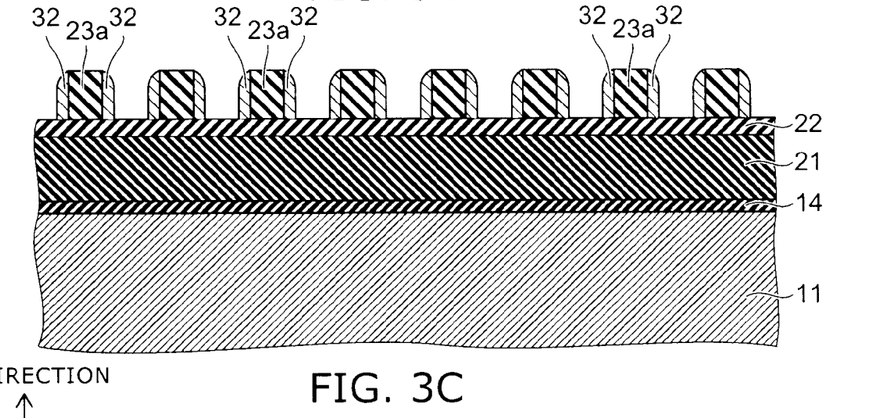

Next, as shown in FIG. 3C, a silicon film is formed. Then, by etch-back by e.g. RIE (reactive ion etching), a sidewall 32 made of silicon is formed on both side surfaces of the core member 23a. At this time, a plurality of sidewalls 32 are arranged periodically in the X direction. In other words, the width and spacing of the core members 23a and the film thickness of the silicon film are adjusted so that the sidewalls 32 are periodically arranged.

Figure 4A:
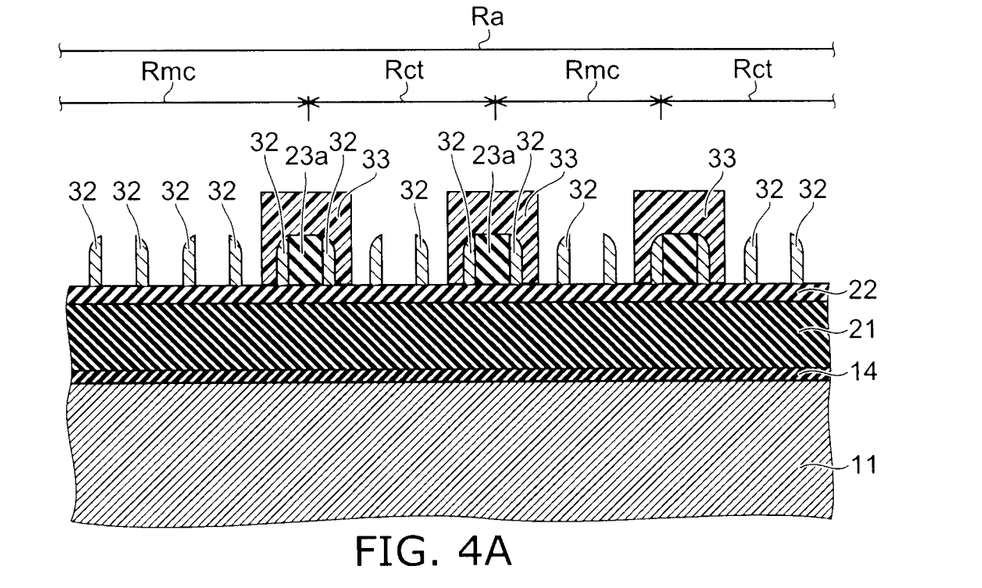
FIGS. 4A to 4C are process sectional views illustrating the method for manufacturing an integrated circuit device according to the embodiment.

Next, as shown in FIG. 4A, a resist film is formed and patterned by the photolithography method to form resist members 33. The resist member 33 covers each core member 23a located at the boundary between the memory cell region Rmc and the contact region Rct, and the sidewalls 32 formed on both side surfaces thereof.

Next, wet etching is performed under a condition such that silicon oxide is dissolved. Thus, the core member 23a not covered with the resist member 33 is removed. At this time, the silicon nitride film 22, the sidewall 32, and the core member 23a covered with the resist member 33 are left unremoved. Subsequently, the resist member 33 is removed.

Figure 4B:
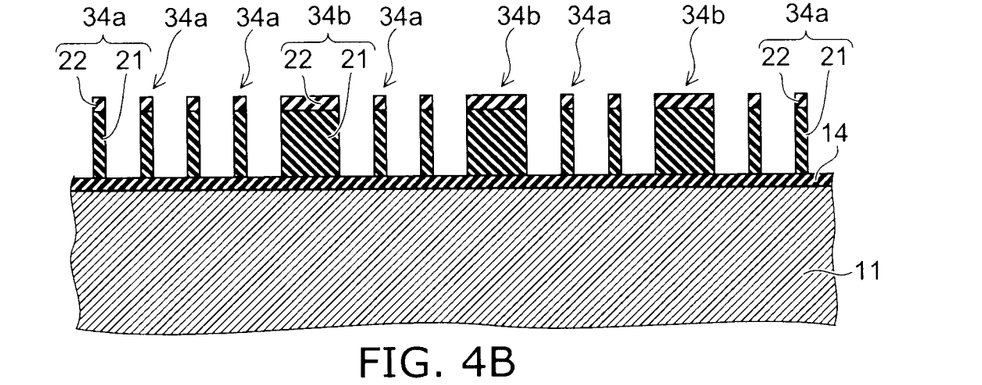

Next, as shown in FIG. 4B, the sidewall 32 and the remaining core member 23a are used as a mask to perform etching such as anisotropic etching. Accordingly, the pattern made of the sidewalls 32 and the core members 23a is transferred to the silicon nitride film 22 and the silicon oxide film 21. Thus, the silicon nitride film 22 and the silicon oxide film 21 are processed into a plurality of mask members 34a and wide mask members 34b extending in the Y direction. At this time, the mask members 34a are formed immediately below the sidewalls 32 (see FIG. 4A) formed on both side surfaces of the removed core member 23a (see FIG. 4A). The wide mask members 34b are formed immediately below the remaining core member 23a and the sidewalls 32 formed on both side surfaces thereof. Hence, the width of the wide mask member 34b is wider than the width of the mask member 34a. The distances between the mask member 34a and the wide mask member 34b are nearly equal to each other.

Figure 4C:
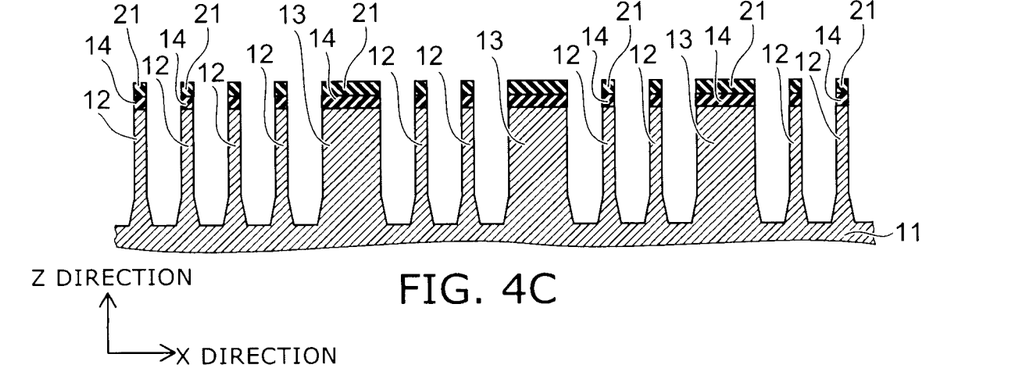

Next, as shown in FIG. 4C, the mask member 34a and the wide mask member 34b are used as a mask to perform etching such as anisotropic etching. Accordingly, the silicon nitride film 14 and an upper portion of the silicon substrate 11 are selectively removed. Thus, the silicon nitride film 14 is divided, and the upper portion of the silicon substrate 11 is processed into a plurality of fins 12 and wide fins 13 extending in the Y direction. At this time, the fin 12 is formed immediately below the mask member 34a, and the wide fin 13 is formed immediately below the wide mask member 34b. Subsequently, as necessary, the silicon oxide film 21, which constituted the lower portion of the mask member 34a and the lower portion of the wide mask member 34b, is removed.

Figure 5A:
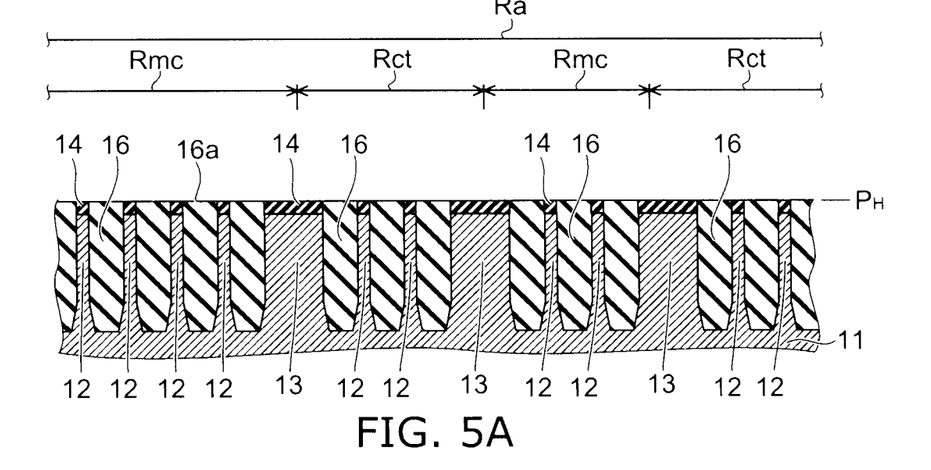
FIGS. 5A to 5C are process sectional views illustrating the method for manufacturing an integrated circuit device according to the embodiment.

Next, as shown in FIG. 5A, by e.g. the coating method, silicon oxide is deposited and heated to form a device isolation insulating film 16 between and above the fins 12 and the wide fins 13. At this time, the device isolation insulating film 16 is densified by heating. Furthermore, the device isolation insulating film 16 is densified also by heat treatment in the subsequent process. Next, the silicon nitride film 14 is used as a stopper to perform planarization treatment such as CMP (chemical mechanical polishing) on the device isolation insulating film 16. Thus, the position of the upper surface 16a of the device isolation insulating film 16 is set to a position $P_H$ aligned with the upper surface of the silicon nitride film 14.

Figure 5B:
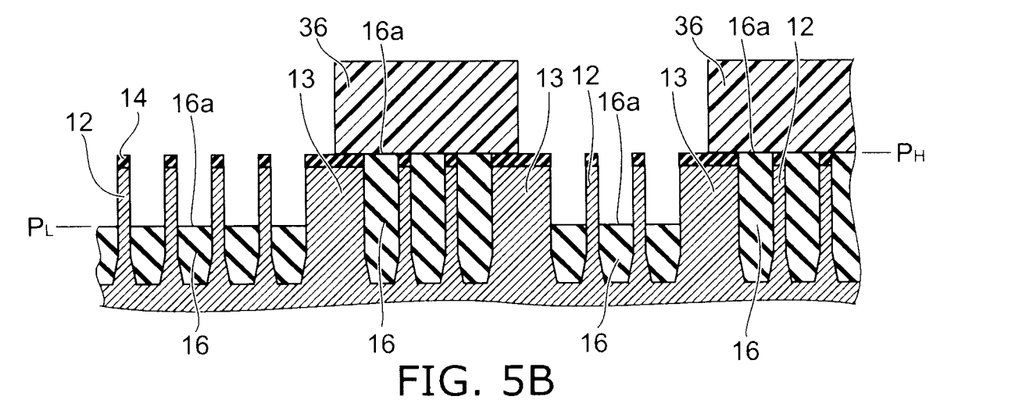

Next, as shown in FIG. 5B, a resist member 36 is formed on the device isolation insulating film 16. The resist member 36 is not placed in the memory cell region Rmc, but placed in the contact region Rct. In the memory array region Ra, the resist member 36 is shaped like a strip extending in the Y direction. At this time, the X-direction edge of the resist member 36 is located immediately above the wide fin 13. Thus, the resist member 36 exposes the portion of the wide fin 13 on the memory cell region Rmc side, the plurality of fins 12 consecutively arranged in the memory cell region Rmc, and the regions therebetween. However, the resist member 36 covers the portion of the wide fin 13 on the contact region Rct side, the fins 12 formed in the contact region Rct, and the regions therebetween. Furthermore, the resist member 36 is formed also in the core region Rc.

Next, the resist member 36 is used as a mask to perform etching such as wet etching. Accordingly, the device isolation insulating film 16 is recessed. The recess amount at this time is determined in accordance with the channel width required in the FinFET to be formed. By this recessing, the upper surface 16a of the portion of the device isolation insulating film 16 not covered with the resist member 36 is lowered to a position $P_L$ below the upper end of the fin 12. As a result, in the memory cell region Rmc, the upper surface 16a of the device isolation insulating film 16 is located at the position $P_L$, and the upper portion of the fin 12 is exposed. On the other hand, in the contact region Rct, the position of the upper surface 16a remains the position $P_H$, and the fin 12 is buried by the device isolation insulating film 16. Also in the core region Rc, the position of the upper surface 16a remains the position $P_H$. Subsequently, the resist member 36 is removed.

Figure 5C:
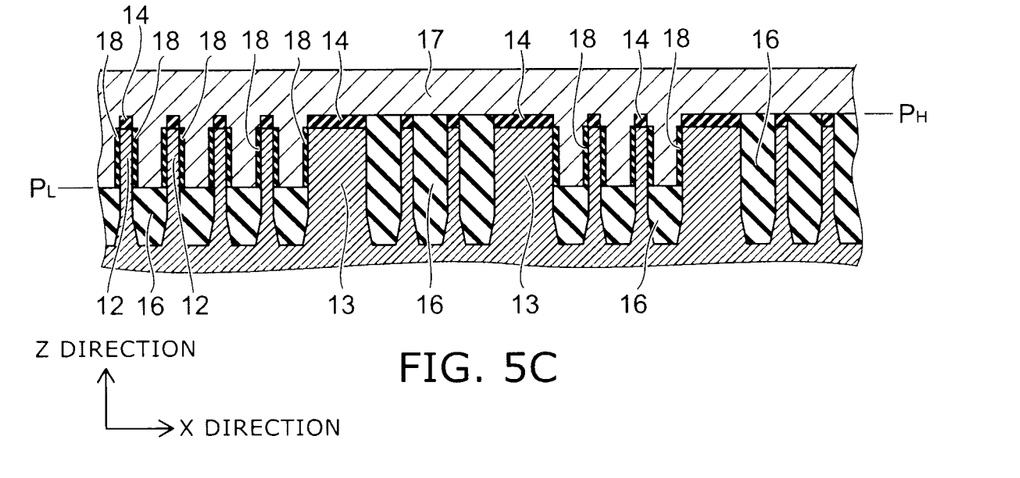

Next, as shown in FIG. 5C, a gate insulating film 18 is formed on the exposed surface of the fins 12 and the wide fins 13. Next, on the device isolation insulating film 16, a conductive film such as a metal film is formed so as to cover the exposed portion of the fins 12 and the wide fins 13. Next, this conductive film is patterned to form a gate electrode 17 extending in the X direction.

Next, as shown in FIGS. 1A and 1B, on the device isolation insulating film 16, an interlayer insulating film 19 is formed so as to cover the gate electrode 17. Next, in the contact region Rct, a contact hole extending to the gate electrode 17 is formed in the interlayer insulating film 19. By burying a conductive material in this contact hole, a contact 20 is formed. Thus, the integrated circuit device 1 according to the embodiment is manufactured.

Next, the effect of the embodiment is described.

In the embodiment, in the step shown in FIG. 3A, resist members 31 are formed entirely in the memory array region Ra, i.e., in both the memory cell region Rmc and the contact region Rct. Accordingly, in the step shown in FIG. 4B, mask members 34a and wide mask members 34b can be formed in both the memory cell region Rmc and the contact region Rct. Then, in the step shown in FIG. 4C, the mask members 34a and the wide mask members 34b are used as a mask to perform etching. Accordingly, fins 12 and wide fins 13 can be formed in both the memory cell region Rmc and the contact region Rct. Thus, fins 12 and wide fins 13 (hereinafter also referred to as "fins 12 and the like") are formed also in the contact region Rct where no FinFETs are finally formed. Thus, in the step shown in FIG. 4C, the microloading effect can be reduced, and the silicon substrate 11 can be etched under a uniform condition throughout the memory array region Ra. As a result, the fins 12 can be formed in a uniform shape, and the characteristics of FinFETs can be made uniform.

More specifically, the effect of etching in forming the fin 12 depends on the distance to the adjacent fin 12 and the like. Thus, if there is a large difference in the distance to the adjacent fin 12 and the like, the shape of the processed fin 12 is significantly varied by the microloading effect. For instance, consider the case where the etching condition is optimized for the arrangement of the fins 12 at a short pitch. Then, if the distance to the adjacent fin 12 and the like is large, the slope of the side surface of the root portion of the fin 12 is increased, and the root portion is thickened. This varies the characteristics of the FinFET whose body region is made of the fin 12. In contrast, according to the embodiment, fins 12 and the like are formed also in the contact region Rct. Hence, the distance between the fins 12 and the like can be made nearly equal, and the effect of etching can be made uniform. As a result, the shape of the fins 12 can be made uniform.

Furthermore, by providing the fins 12 and the like also in the contact region Rct, the upper surface 16a of the device isolation insulating film 16 can be made flat in the contact region Rct. Thus, the upper surface of the gate electrode 17 is made flat. This eliminates the need of treatment for planarizing the upper surface of the gate electrode 17, such as CMP treatment. Thus, the manufacturing cost of the device 1 is reduced.

Furthermore, in the step shown in FIG. 4C, the spacing between the fins 12 and the like is made constant. Thus, in the step shown in FIG. 5A, the device isolation insulating film 16 can be uniformly formed. For instance, the shrinkage ratio of the device isolation insulating film 16 under heating and densification is made uniform. Thus, the composition of the device isolation insulating film 16 is made uniform. As a result, in the step shown in FIG. 5B, in etching the device isolation insulating film 16 located in the memory cell region Rmc, a uniform etching rate can be obtained. Thus, the upper surface 16a of the device isolation insulating film 16 can be made flat. Hence, when gate electrodes 17 are formed in the step shown in FIG. 5C, the length of the portion of the fin 12 covered with the gate electrode 17 is made uniform. Thus, the channel width of the FinFET is made uniform. As a result, the characteristics of the FinFETs can be made uniform.

In particular, in the step shown in FIG. 3A, the arrangement pitch of the resist members 31 is adjusted. In the step shown in FIG. 3B, the width of the core member 23a is adjusted. Thus, in the step shown in FIG. 3C, the arrangement pitch of the sidewalls 32 is made constant. Then, when fins 12 and wide fins 13 are formed, imaginary lines L as shown in FIG. 1A can be established. As a result, the distance between the fins 12 and the wide fins 13 is made more uniform, and the characteristics of the FinFETs can be made more uniform.

Furthermore, in the embodiment, in the step shown in FIG. 5A, the position of the upper surface 16a of the device isolation insulating film 16 is set to the position $P_H$ of the upper surface of the silicon nitride film 14. Then, in the step shown in FIG. 5B, the resist member 36 is formed so as to cover the contact region Rct. Subsequently, etching is performed. Thus, in the contact region Rct, the device isolation insulating film 16 is not etched, and each fin 12 is entirely covered with the device isolation insulating film 16. As a result, in the contact region Rct, no FinFET is formed. Thus, a dummy FinFET not constituting a memory cell is not formed. This stabilizes the operation of the integrated circuit device 1.

In the contact region Rct where no FinFET is formed, the position of the upper surface 16a of the device isolation insulating film 16 is made relatively higher, and by that amount, the gate electrode 17 is made thinner. This can reduce the parasitic capacitance of the gate electrode 17. Furthermore, the distance between the silicon substrate 11 and the gate electrode 17 can be made longer. Hence, the parasitic capacitance between the silicon substrate 11 and the gate electrode 17 can also be reduced. Thus, the operation of the integrated circuit device 1 is made fast. Likewise, as shown in FIG. 2, also in the core region Rc, the upper surface 16a of the device isolation insulating film 16 is located at a relatively high position $P_H$. This can reduce the parasitic capacitance of the gate electrode 17 and the parasitic capacitance between the silicon substrate 11 and the gate electrode 17. Also for this reason, the operation of the integrated circuit device 1 can be made fast.

Furthermore, in the embodiment, a silicon nitride film 14 having a thicker electrical film thickness than the gate insulating film 18 is provided between the upper surface of the fin 12 and the gate electrode 17, and between the upper surface of the wide fin 13 and the gate electrode 17. Thus, the capacitance between the fin 12 and the wide fin 13 on the one hand and the gate electrode 17 on the other is reduced. This can suppress that the upper portion of the fin 12 and the wide fin 13 is operated as a transistor. Also for this reason, the operation of the integrated circuit device 1 can be made fast and stable.

Moreover, in the embodiment, in the step shown in FIG. 4A, the resist member 33 is formed so as to cover each core member 23a located at the boundary region between the memory cell region Rmc and the contact region Rct, and the sidewalls 32 formed on both side surfaces thereof. As a result, a wide mask member 34b is formed in the step shown in FIG. 4B, and a wide fin 13 is formed in the step shown in FIG. 4C. Thus, by merging (integrating) two adjacent fins 12, a wide fin 13 can be easily formed. Furthermore, forming a wide fin 13 by merging two fins 12 causes no variation in the distance between the fins 12 and the wide fins 13. Thus, the above effects are not compromised.

The wide fins 13 are formed immediately below a subset of the core members 23a (see FIG. 3C). On the other hand, the line L shown in FIG. 1A is established immediately below the sidewall 32 (see FIG. 3C). Among the spaces between the sidewalls 32, the core members 23a are placed in every other space. The spaces between the lines L can be sequentially numbered along the X direction. Then, all the spaces located inside the wide fins 13 are either the odd-numbered spaces or the even-numbered spaces.

The wide fin 13 has a wider width and higher mechanical strength than the fin 12. Hence, even if a lateral force is applied by shrinkage of the device isolation insulating film 16, the wide fin 13 is less likely to bend or collapse. More specifically, in the step shown in FIG. 5B, the portion of the device isolation insulating film 16 located in the memory cell region Rmc is etched. After this step, the two side surfaces of the wide fin 13 are different in the area in contact with the device isolation insulating film 16. Thus, when the device isolation insulating film 16 is shrunk by e.g. heat treatment, the wide fin 13 is subjected to a large lateral force directed from the memory cell region Rmc side to the contact region Rct side. However, the wide fin 13 is thicker and has higher mechanical strength than the fin 12. Thus, the wide fin 13 can withstand this force and is less likely to bend or collapse. As a result, the yield of the integrated circuit device 1 is improved. Likewise, at the boundary between the memory cell region Rmc and the contact region Rct, a large force occurs due to the shrinkage of the device isolation insulating film 16. However, the wide fin 13 rather than the fin 12 is placed at this boundary. This reduces the possibility of bending or collapse.

Furthermore, a wide fin 13 wider than the fin 12 is provided in the boundary region between the memory cell region Rmc and the contact region Rct. Then, in the step shown in FIG. 5B, when the resist member 36 is formed, the edge of the resist member 36 only needs to be located immediately above the wide fin 13. This facilitates alignment in forming the resist member 36. As a result, the manufacturing cost and production efficiency of the device 1 are improved.

Next, a variation of the embodiment is described.

Figure 6A:
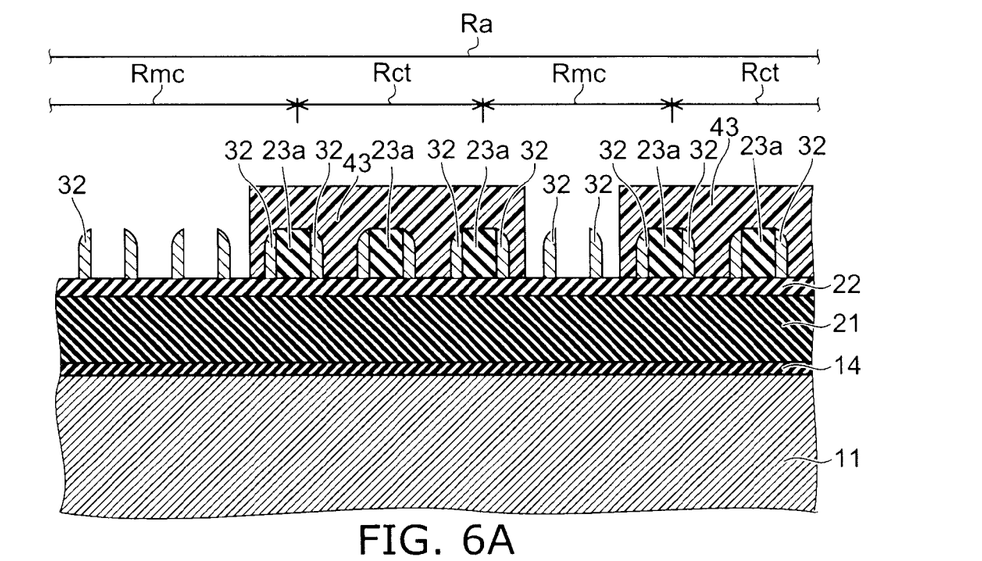
FIGS. 6A to 6C are process sectional views illustrating the method for manufacturing an integrated circuit device according to a variation of the embodiment.
Figure 6B:
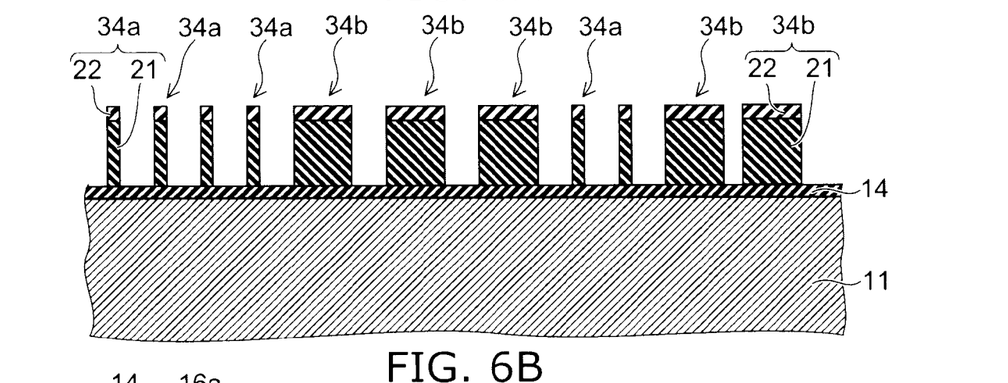
Figure 6C:
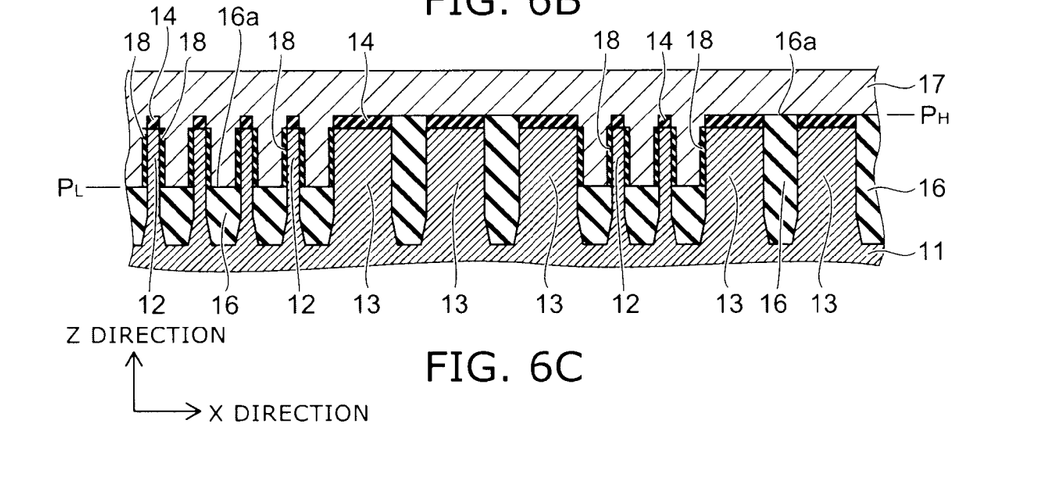

FIGS. 6A to 6C are process sectional views illustrating a method for manufacturing an integrated circuit device according to the variation, and show the memory array region.

In the following, the method for manufacturing an integrated circuit device according to the variation is described.

First, as in the above embodiment, the steps shown in FIGS. 3A to 3C are performed.

Next, as shown in FIG. 6A, on the silicon nitride film 22, resist members 43 are formed. Unlike the resist member 33 (see FIG. 4A) in the above embodiment, the resist member 43 is formed entirely in the contact region Rct. Thus, at least part of the resist member 43 covers all the core members 23a located in the contact region Rct, and the sidewalls 32 formed on both side surfaces thereof. Then, the sidewalls 32 and the resist members 43 are used as a mask to perform etching.

Thus, as shown in FIG. 6B, in the contact region Rct, no mask member 34a is formed, but only wide mask members 34b are formed.

Next, as in the above embodiment, the steps shown in FIGS. 4C to 5C are performed.

Thus, as shown in FIG. 6C, in the contact region Rct, no fin 12 is formed, but only wide fins 13 are formed. In the contact region Rct, the device isolation insulating film 16 covers entirely the side surface of the wide fin 13. Also in the variation, as in the above embodiment, imaginary lines L (see FIG. 1A) can be established, and the spaces between the lines L can be sequentially numbered along the X direction. Then, the spaces located inside the wide fins 13 are either at least a subset of the odd-numbered spaces or at least a subset of the even-numbered spaces.

According to the variation, in the step shown in FIG. 6A, the resist member 43 can be formed larger than the resist member 33 (see FIG. 4A). This facilitates patterning the resist member 43. The configuration, manufacturing method, and effect of the variation other than the foregoing are similar to those of the above embodiment.

Next, a comparative example of the embodiment is described.

Figure 7A:
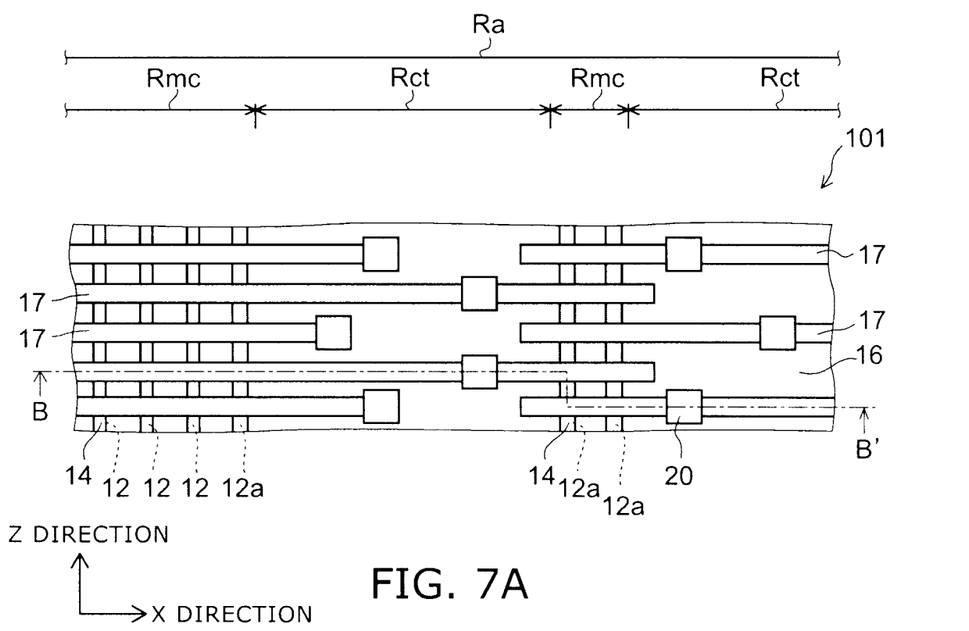
FIG. 7A is a plan view illustrating an integrated circuit device according to the comparative example.
Figure 7B:
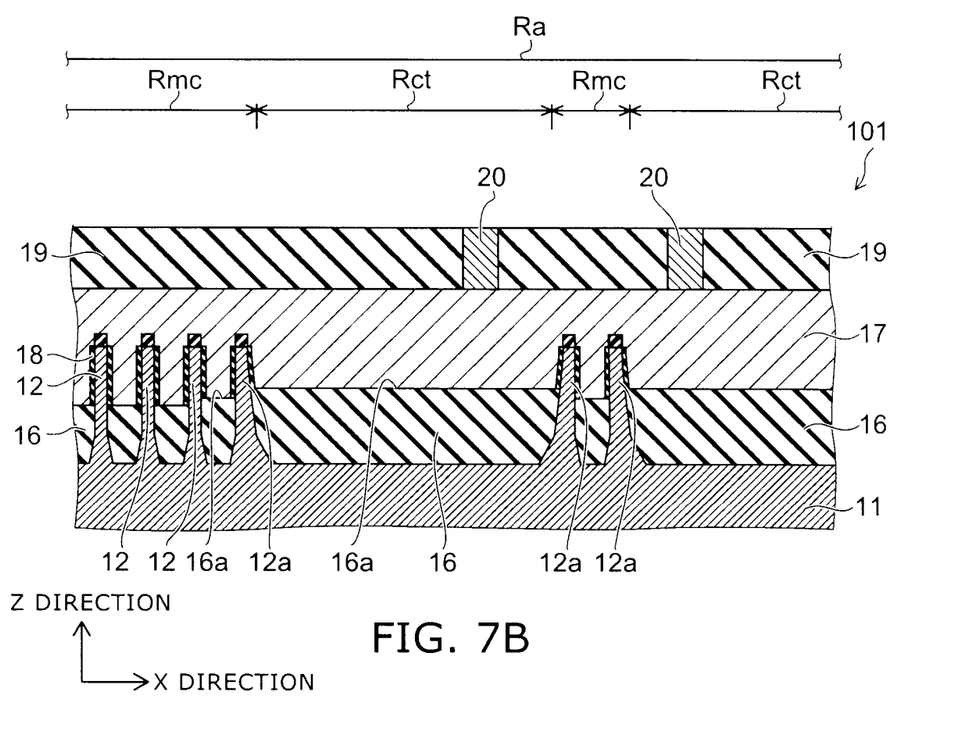
FIG. 7B is a sectional view taken along line B-B' shown in FIG. 7A.

FIG. 7A is a plan view illustrating an integrated circuit device according to the comparative example. FIG. 7B is a sectional view taken along line B-B' shown in FIG. 7A.

As shown in FIGS. 7A and 7B, in the integrated circuit device 101 according to the comparative example, the wide fins 13 (see FIGS. 1A and 1B) are not formed. Furthermore, the fins 12 are formed only in the memory cell region Rmc, and not formed in the contact region Rct.

Here, in FIG. 7A, the gate insulating film 18 and the interlayer insulating film 19 are not shown.

In the comparative example, in the contact region Rct, the fins 12 and the like are not formed over a wide space. Thus, when the silicon substrate 11 is etched to form fins 12, by the microloading effect, the degree of etching is varied between in the memory cell region Rmc and in the contact region Rct. As a result, for instance, among the fins 12 formed in the memory cell region Rmc, the fin 12a formed at the position nearest to the contact region Rct is made generally thicker than the other fins 12. The side surface on the contact region Rct side is tapered not only in the root portion but also entirely, including the upper portion. The slope of the side surface in the root portion is made more gradual. Thus, in the fin 12a, the root portion is made thicker than in the other fins 12.

Furthermore, between in the memory cell region Rmc and in the contact region Rct, the degree of densification of the device isolation insulating film 16 is different, and hence the etching rate of the device isolation insulating film 16 is made different. As a result, between in the memory cell region Rmc and in the contact region Rct, the position of the upper surface 16a of the device isolation insulating film 16 is made different. Thus, also in the memory cell region Rmc, the position of the upper surface 16a is varied with the distance from the contact region Rct. For instance, in the contact region Rct, the device isolation insulating film 16 is buried in a wider space than in the memory cell region Rmc. Hence, in the contact region Rct, densification proceeds further, and the etching rate is made lower. As a result, the position of the upper surface 16a is made higher.

By these factors, the characteristics of the FinFET are varied with the placed position. In particular, the characteristics of the FinFET constituted by the fin 12a formed at a position near the contact region Rct are made significantly different from the characteristics of the other FinFETs.

In the embodiment and the variation described above, the integrated circuit device is an MRAM as an example. However, the integrated circuit device is not limited thereto. The embodiment and the variation described above are suitably applicable to any integrated circuit device requiring FinFETs to be arranged with high density.

The embodiment described above can realize an integrated circuit device and a method for manufacturing the same in which FinFETs have uniform characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An integrated circuit device comprising:
a plurality of fins formed on an upper surface of a semiconductor substrate and extending in a first direction;
a wide fin formed on the upper surface of the semiconductor substrate, extending in the first direction, and having a wider width than widths of the fins;
a device isolation insulating film placed between the fins and the wide fin;
a gate electrode extending in a second direction crossing the first direction and provided on the device isolation insulating film;
a first insulating film located between upper surfaces of the fins and the gate electrode; and
a second insulating film located between side surfaces of the fins and the gate electrode,
in a first region where a part of the fins are consecutively arranged, an upper surface of the device isolation insulating film being located at a first position below upper ends of the fins, and in a second region located in the second direction as viewed from the first region, the upper surface of the device isolation insulating film being located at a second position above the upper ends of the fins,
in the second region, an other part of the fins being provided, the device isolation insulating film covering entirely the side surfaces of the other part of the fins, and
the wide fin being placed at a boundary between the first region and the second region.

2. The device according to claim 1, wherein
a plurality of imaginary lines extending in the first direction, arranged periodically in the second direction, and each located inside the fin or the wide fin can be established, and
each of the fins contains one of the lines, and the wide fin contains two of the lines.

3. The device according to claim 2, wherein when spaces between the lines are sequentially numbered along the second direction, all the spaces located inside the wide fins are either at least a subset of odd-numbered ones of the spaces or at least a subset of even-numbered ones of the spaces.

4. The device according to claim 1, further comprising:
an other wide fin formed on the upper surface of the semiconductor substrate, extending in the first direction, and having a wider width than the fins,
wherein
the device is a memory device in which a memory array region and a core region are defined,
the memory array region has the first region and the second region,
the fins are placed inside the memory array region, and
the other wide fin is placed at a boundary between the memory array region and the core region.

5. The device according to claim 4, wherein in the core region, the fins are not placed, and the upper surface of the device isolation insulating film is located at the second position.

6. The device according to claim 1, wherein the width of the wide fin is equal to sum of distance between two adjacent ones of the fins and the widths of two of the fins.

7. The device according to claim 1, wherein electrical film thickness of the first insulating film is thicker than electrical film thickness of the second insulating film.

8. The device according to claim 1, wherein the device is a magnetoresistive random access memory.

9. An integrated circuit device comprising:
a plurality of fins formed on an upper surface of a semiconductor substrate and extending in a first direction;
a wide fin formed on the upper surface of the semiconductor substrate, extending in the first direction, and having a wider width than widths of the fins;
a device isolation insulating film placed between the fins and the wide fin;
a gate electrode extending in a second direction crossing the first direction and provided on the device isolation insulating film;
a first insulating film located between an upper surfaces of the fins and the gate electrode; and
a second insulating film located between side surfaces of the fins and the gate electrode,
a plurality of imaginary lines extending in the first direction, arranged periodically in the second direction, and each located inside the fin or the wide fin being able to be established, and
each of the fins containing one of the lines, and the wide fin containing two of the lines.

* * * * *